(12) United States Patent
Lee

(10) Patent No.: US 6,603,169 B2
(45) Date of Patent: Aug. 5, 2003

(54) FERROELECTRIC CAPACITORS FOR INTEGRATED CIRCUIT MEMORY DEVICES AND METHODS OF MANUFACTURING SAME

(75) Inventor: Kyu-mann Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/900,269

(22) Filed: Jul. 6, 2001

(65) Prior Publication Data

US 2002/0074588 A1 Jun. 20, 2002

(30) Foreign Application Priority Data

Dec. 20, 2000 (KR) ......................................... 2000-79189

(51) Int. Cl.⁷ ............................................. H01L 29/72
(52) U.S. Cl. ...................... 257/310; 257/298; 257/303
(58) Field of Search ................................. 257/310, 298, 257/303, 306, 532, 59, 72, 347, 64, 65, 66, 67; 438/120, 255; 357/51

(56) References Cited

U.S. PATENT DOCUMENTS

| | | | | |
|---|---|---|---|---|
| 4,914,497 A | * | 4/1990 | Kondo | 357/51 |
| 5,302,843 A | * | 4/1994 | Yamazaki | 257/296 |
| 5,403,763 A | * | 4/1995 | Yamazaki | 437/44 |
| 5,464,786 A | * | 11/1995 | Figura et al. | 438/396 |
| 5,504,041 A | * | 4/1996 | Summerfelt | 438/396 |
| 5,877,062 A | | 3/1999 | Horii | |
| 5,994,153 A | * | 11/1999 | Nagel et al. | 438/3 |
| 6,054,332 A | * | 4/2000 | Cho | 438/3 |
| 6,084,765 A | * | 7/2000 | Lee | 361/311 |
| 6,130,124 A | * | 10/2000 | Lee | 438/240 |
| 6,144,060 A | * | 11/2000 | Park et al. | 257/310 |
| 6,168,990 B1 | * | 1/2001 | Kim | 438/253 |
| 6,175,127 B1 | * | 1/2001 | Hong | 257/295 |
| 6,180,447 B1 | * | 1/2001 | Park et al. | 438/240 |
| 6,204,105 B1 | * | 3/2001 | Jung | 438/238 |
| 6,229,171 B1 | * | 5/2001 | Chun et al. | 257/296 |
| 6,232,133 B1 | * | 5/2001 | Kim et al. | 438/3 |
| 6,236,063 B1 | * | 5/2001 | Yamazaki et al. | 257/59 |
| 6,319,769 B1 | * | 11/2001 | Cho | 438/255 |

FOREIGN PATENT DOCUMENTS

| | | | | |
|---|---|---|---|---|
| JP | 11-54718 | * | 2/1999 | 218/242 |
| KR | 1999-012976 | | 2/1999 | |

* cited by examiner

*Primary Examiner*—Carl Whitehead, Jr.
*Assistant Examiner*—Laura M Schillinger
(74) *Attorney, Agent, or Firm*—Myers Bigel Sibley & Sajovec PA

(57) ABSTRACT

Methods of forming integrated circuit capacitors having dielectric layers therein that comprise ferroelectric materials, include the use of protective layers to block the infiltration of hydrogen into the ferroelectric material. By blocking the infiltration of hydrogen, the hysteresis characteristics of the ferroelectric materials can be preserved. A preferred integrated circuit capacitor comprises a semiconductor substrate and a lower capacitor electrode on the semiconductor substrate. A capacitor dielectric layer that comprises a ferroelectric material, is provided on the lower capacitor electrode. An upper capacitor electrode is also provided on the capacitor dielectric layer. In order to inhibit degradation of the ferroelectric characteristics of the capacitor dielectric layer, a protective layer is utilized to cover the capacitor dielectric layer. In particular, the protective layer is formed to encapsulate the upper capacitor electrode and the capacitor dielectric layer. The protective layer preferably includes a material that is substantially free of hydrogen and has a chemical and/or physical structure that blocks transfer (e.g., diffusion) of hydrogen therethrough. The protective layer may also have a thickness of greater than about 50 Å, in order to further inhibit transfer of hydrogen from outside the protective layer to the underlying capacitor dielectric layer. The protective layer may comprise a metal oxide selected from the group consisting of $Al_2O_3$, $TiO_2$, $SiO_2$, $ZrO_2$ and $CeO_2$.

19 Claims, 4 Drawing Sheets

FERROELECTRIC CAPACITORS FOR INTEGRATED CIRCUIT MEMORY DEVICES AND METHODS OF MANUFACTURING SAME

RELATED APPLICATION

This application is related to Korean Application No. 2000-79189, filed Dec. 20, 2000, the disclosure of which is hereby incorporated herein by reference.

FIELD OF THE INVENTION

The present invention relates to semiconductor devices and methods of manufacturing semiconductor devices, and more particularly, to integrated circuit capacitors and methods of manufacturing integrated circuit capacitors.

BACKGROUND OF THE INVENTION

Ferroelectric substances may be used as dielectric layer materials in ferroelectric capacitors that are integrated in semiconductor memory devices. The ferroelectric substance exhibits voluntary polarization throughout a range of temperatures without an external electric field. Moreover, if a reverse electric field is applied to the ferroelectric substance, its polarized state can be inverted from one direction to an opposite direction. The ferroelectric substance has hysteresis characteristics according to the direction and size of the applied electric field. Ferroelectric random access memory (FRAM) devices utilize the hysteresis characteristics of the ferroelectric substance to achieve non-volatile performance characteristics.

A difficult problem associated with the manufacture of a ferroelectric capacitor has been the infiltration of hydrogen into ferroelectric materials during various etching processes and insulation layer forming processes. This infiltration of hydrogen can deteriorate the hysteresis characteristics of the ferroelectric material within the capacitor and degrade its non-volatile performance.

FIGS. 1 and 2 are cross-sectional views illustrating a conventional method of manufacturing a ferroelectric capacitor of a semiconductor device. Referring to FIG. 1, a first metal layer 40 (for a lower electrode layer of a ferroelectric capacitor) is formed on a lower interlayer dielectric layer 20 placed on a semiconductor substrate 10. The first metal layer 40 is connected to an impurity region in the semiconductor substrate via a contact plug 30 that penetrates the lower interlayer dielectric layer 20. Next, a ferroelectric layer and a second metal layer are sequentially formed on the first metal layer 40. The second metal layer is used for forming an upper electrode layer. The second metal layer and the ferroelectric layer are sequentially patterned to form a second metal layer pattern 60 and a ferroelectric layer pattern 50. Next, an oxide layer 70 is formed so as to be used as an etching mask in patterning the first metal layer 40. Conventionally, a phosphosilicate glass (PSG) layer is used as the oxide layer 70. Alternatively, a titanium nitride (TiN) layer may be used instead of the oxide layer 70.

Referring to FIG. 2, a first metal layer pattern 45 is formed by partially removing the first metal layer 40 using the oxide layer 70 as an etching mask. Next, a barrier layer 80 covering the first metal layer pattern 45 and the oxide layer 70 is formed. A $TiO_2$ layer 81 and an $Al_2O_3$ layer 82 may be used as the barrier layer 80. In some cases, only the $TiO_2$ layer 81 is used. Next, an upper interlayer dielectric layer 90 is formed on the barrier layer 80.

In the method for manufacturing a ferroelectric capacitor as described above, the oxide layer 70, having a relatively low hydrogen content, is used as an etching mask and the barrier layer 80, which includes a $TiO_2$ layer 81 and an $Al_2O_3$ layer 82, is formed before formation of the upper interlayer dielectric layer 90. The oxide layer 70 and the barrier layer 80 operate to inhibit the characteristics of the ferroelectric layer pattern 50 from deteriorating due to penetration of hydrogen. However, because the oxide layer 70 may contain some hydrogen, hydrogen may infiltrate into the ferroelectric layer pattern 50. Also, there are frequently problems associated with the formation of the barrier layer 80. For example, in the event the $TiO_2$ layer 81 is used alone, a high temperature thermal treatment process is typically required for enhancing the dielectric characteristics of the layer. During the thermal treatment process, however, a metal barrier layer (not shown) placed between the first metal layer pattern 40 and the underlying contact plug 30 may be oxidized and the contact resistance of the contact plug 30 may increase. To inhibit the increase in contact resistance, a dual layer consisting of the $TiO_2$ layer 81 and the $Al_2O_3$ layer 82 should be used as the barrier layer 80 and in this case, a low temperature thermal treatment process may be performed on the barrier layer 80 after the $TiO_2$ layer 81 is formed. However, in a step for forming a via hole in a peripheral circuit region, which is typically performed after formation of a ferroelectric capacitor, the size of the via hole may be reduced due to a difference in etching selectivity between the barrier layer 80 and an adjacent dielectric layer (not shown). Accordingly, the contact resistance in the peripheral circuit region may increase. To solve this problem, an additional process for removing the barrier layer 80 in the peripheral circuit region, particularly, the $TiO_2$ layer 81, typically must be performed.

SUMMARY OF THE INVENTION

Methods of forming integrated circuit capacitors having dielectric layers therein that comprise ferroelectric materials, include the use of protective layers to block the infiltration of hydrogen into the ferroelectric material. By blocking the infiltration of hydrogen, the hysteresis characteristics of the ferroelectric materials can be preserved. According to one embodiment of the present invention, an integrated circuit capacitor is provided that comprises a semiconductor substrate and a lower capacitor electrode on the semiconductor substrate. A capacitor dielectric layer that comprises a ferroelectric material, is provided on the lower capacitor electrode. An upper capacitor electrode is also provided on the capacitor dielectric layer. In order to inhibit degradation of the ferroelectric characteristics of the capacitor dielectric layer, a protective layer is utilized to cover the capacitor dielectric layer. In particular, the protective layer is formed to encapsulate the upper capacitor electrode and the capacitor dielectric layer. The protective layer preferably includes a material that is substantially free of hydrogen and has a chemical and/or physical structure that blocks transfer (e.g., diffusion) of hydrogen therethrough. The protective layer may also have a thickness of greater than about 50 Å, in order to further inhibit transfer of hydrogen from outside the protective layer to the underlying capacitor dielectric layer. The protective layer may comprise a metal oxide selected from the group consisting of $Al_2O_3$, $TiO_2$, $SiO_2$, $ZrO_2$ and $CeO_2$. The ferroelectric material may also comprise one or more of the following materials: $SrTiO_3$, $BaTiO_3$, $(Ba, Sr)TiO_3$, $Pb(Zr, Ti)O_3$, $SrBi_2Ta_2O_9$, $(Pb, La)(Zr, Ti)O_3$ and $Bi_4Ti_3O_{12}$. To achieve high oxidation resistance and low electrical resistance, the lower and upper capacitor electrodes preferably comprise a platinum-group metal layer, a platinum-group metal oxide layer or a composite of a platinum-group metal layer and a platinum-group metal oxide layer.

Methods of forming integrated circuit capacitors according to embodiments of the present invention include forming an interlayer dielectric layer on a semiconductor substrate and then sequentially forming a first electrode layer on the interlayer dielectric layer, a capacitor dielectric layer comprising a ferroelectric material on an upper surface of the first electrode layer and a second electrode layer on the capacitor dielectric layer. A step is then performed to pattern the second electrode layer as an upper capacitor electrode and pattern the capacitor dielectric layer as a capacitor dielectric. These patterning steps may cause the upper surface of the first electrode layer to be exposed.

The upper capacitor electrode and the capacitor dielectric are then encapsulated by depositing a protective layer on the upper surface of the first electrode layer and on the upper capacitor electrode and the capacitor dielectric. The protective layer comprises a material that is substantially free of hydrogen and has a chemical and/or physical structure that blocks transfer of hydrogen therethrough. Following formation of the protective layer, the protective layer and the first electrode layer are patterned to define a lower capacitor electrode and expose an upper surface of the interlayer dielectric layer. The step of depositing the protective layer may include an atomic layer deposition process. The encapsulating step may also be preceded by the step of annealing the capacitor dielectric at a temperature in a range between about 400° C. and 500° C. The encapsulating step may also be followed by the step of annealing the capacitor dielectric at a temperature in a range between about 400° C. and 500° C., however, this annealing step may be omitted if a prior annealing step has been performed.

DESCRIPTION OF THE PREFERRED EMBODIMENTS

Figure 1:
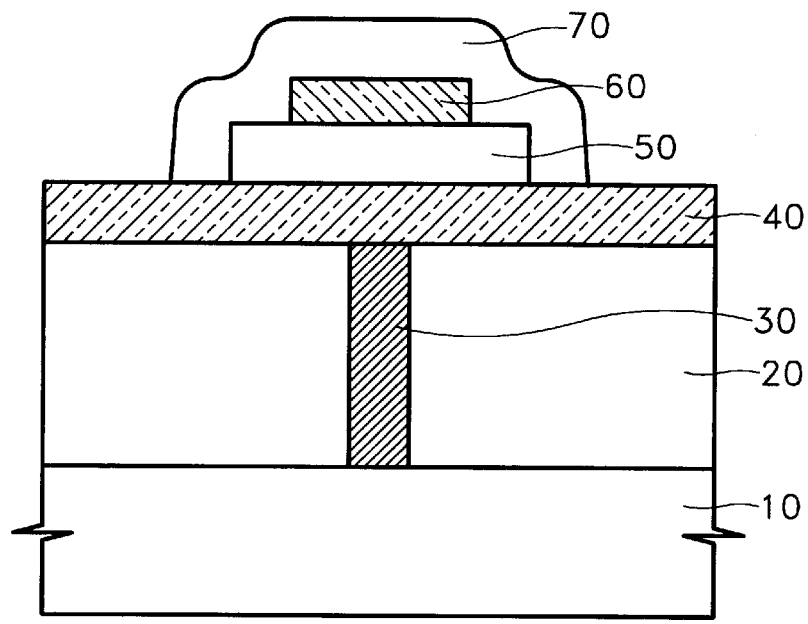
FIGS. 1 and 2 are cross-sectional views of intermediate structures that illustrate a conventional method of manufacturing a ferroelectric capacitor of a semiconductor memory device.
Figure 2:
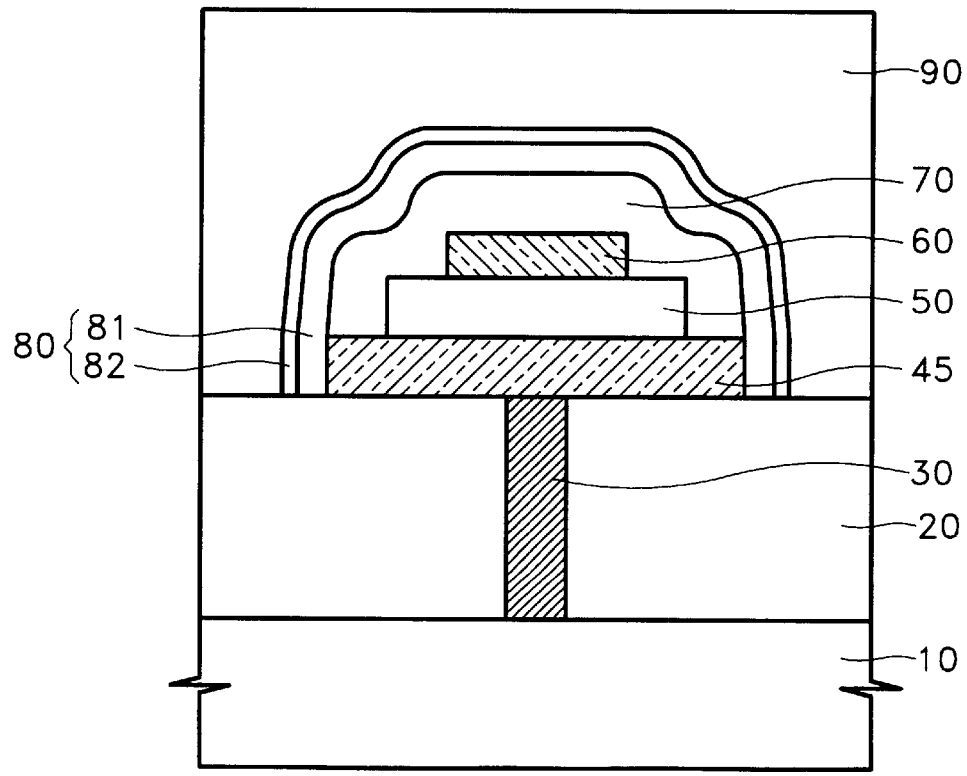

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be through and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. However, when a layer is referred to as being "directly on" another layer, substrate or region, no intervening layers are present. Like reference numerals refer to like elements throughout.

Figure 3:
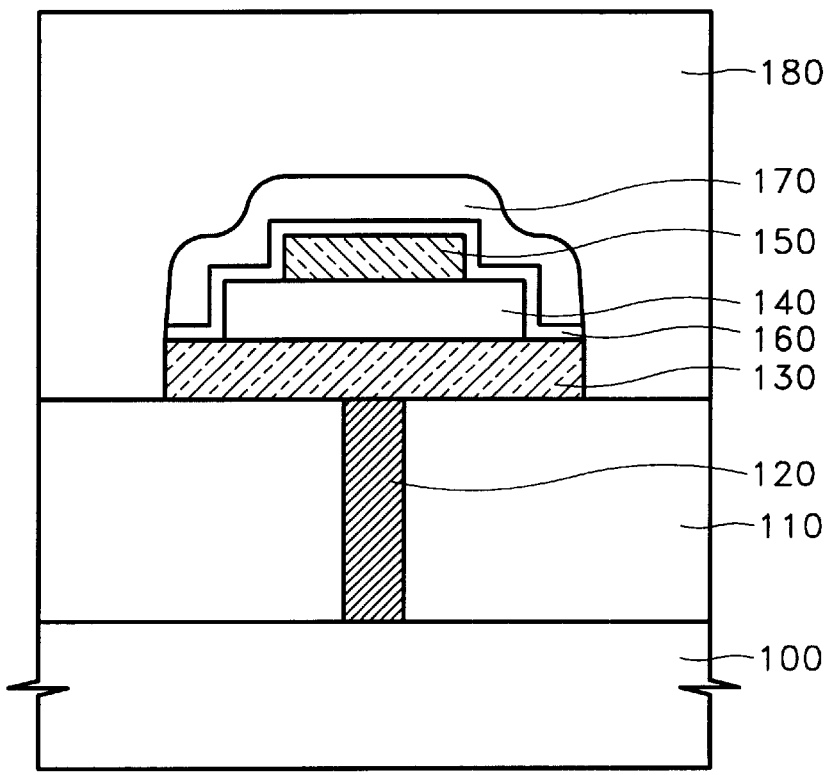
FIG. 3 is a cross-sectional view of a ferroelectric capacitor of a semiconductor memory device according to an embodiment of the present invention.

FIG. 3 is a cross sectional view illustrating a ferroelectric capacitor of a semiconductor memory device according to an embodiment of the present invention. As illustrated in FIG. 3, the ferroelectric capacitor has a structure in which a ferroelectric layer pattern 140, a second (upper) electrode layer pattern 150, a protective layer pattern 160 and an interlayer dielectric layer 180 are formed on a first (lower) electrode layer pattern 130.

The first electrode layer pattern 130 is connected to a conductive contact plug 120 that penetrates a lower interlayer dielectric layer 110 and is in contact with an impurity region within a semiconductor substrate 100. This impurity region may constitute a source/drain region of a memory cell access transistor. A metal barrier layer, such as a Ti layer (not shown), can be disposed between the first electrode layer pattern 130 and the contact plug 120. A platinum group metal layer, which is a conductive substance layer exhibiting high conductivity and oxidation-resistant characteristics, may be used as the first metal electrode layer 130. In other words, a platinum (Pt) layer, a ruthenium (Ru) layer, an iridium (Ir) layer, a rhodium (Rh) layer, an osmium (Os) layer or a palladium (Pd) layer may be used to form the first electrode layer pattern 130. In some cases, a platinum group oxide layer or a composite of a platinum group metal layer and the platinum group oxide layer, is used to form the first electrode layer pattern 130. The ferroelectric layer pattern 140 is preferably a $SrTiO_3$ layer, a $(BaTiO_3)$ layer, a $(Ba, Sr)TiO_3$ layer, a $Pb(Zr, Ti)O_3$ layer, a $SrBi_2Ta_2O_9$ layer, a $(Pb, La)(Zr, Ti)O_3$ layer or a $Bi_4Ti_3O_{12}$ layer.

The second electrode layer pattern 150 is preferably formed as a platinum-group metal layer. Accordingly, a platinum (Pt) layer, a ruthenium (Ru) layer, an iridium (Ir) layer, a rhodium (Rh) layer, an osmium (Os) layer or a palladium (Pd) layer may be used to form the second electrode layer pattern 150. In some cases, a platinum group oxide layer or a composite of a platinum group metal layer and the platinum group oxide layer, may be used to form the second electrode layer pattern 150.

The protective layer pattern 160 is formed to cover the first electrode layer pattern 130, the ferroelectric layer pattern 140 and the second electrode layer pattern 150. The protective layer pattern 160 is an electrically insulating layer that inhibits hydrogen components from infiltrating into the ferroelectric layer pattern 140. To sufficiently block the infiltration of hydrogen, the protective layer pattern 160 should be formed to have a thickness of at least about 50 Å. Preferably, the protective layer pattern 160 is an oxide layer that is free of hydrogen. The protective layer pattern 160 may comprise materials such as $Al_2O_3$, $TiO_2$, $SiO_2$, $ZrO_2$ or $CeO_2$. The protective layer pattern 60 may be deposited by an atomic layer deposition (ALD) technique. An etching mask layer pattern 170, which is used as a mask to pattern the first electrode layer pattern 130, is disposed on the protective layer pattern 160. An upper interlayer dielectric layer 180 is disposed on the etching mask layer pattern 170. A mono layer of a phosphosilicate glass (PSG) or a dual layer of PSG and TiN can be used as the etching mask layer pattern 170. The protective layer pattern 160 inhibits external hydrogen components from infiltrating into the ferroelectric layer pattern 140, and thereby improves the characteristics of the ferroelectric capacitor.

Figure 4:
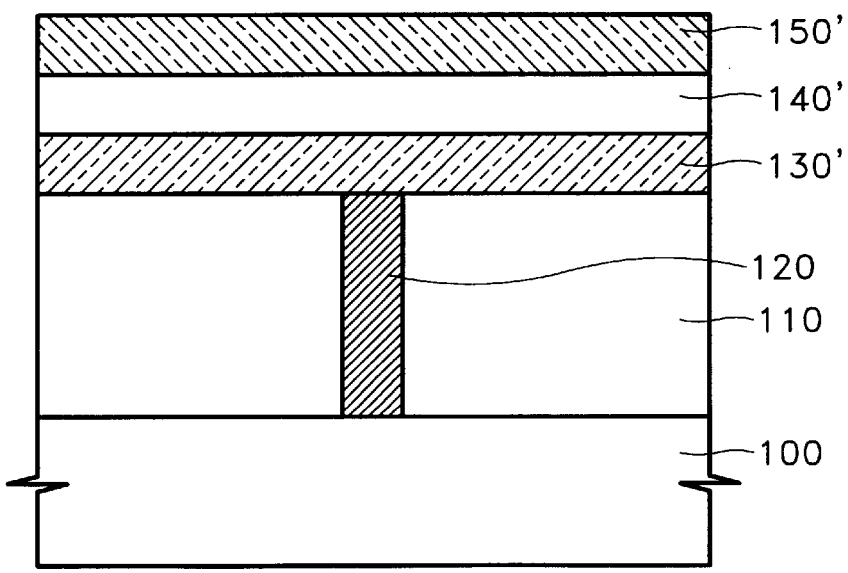
FIGS. 4 through 7 are cross-sectional views of intermediate structures that illustrate methods of manufacturing a ferroelectric capacitor of a semiconductor memory device according to an embodiment of the present invention.

FIGS. 4 through 7 are cross-sectional views of intermediate structures that illustrate preferred methods of manufacturing ferroelectric capacitors according to embodiments of the present invention. Referring to FIG. 4, a first electrode layer 130' is formed so as to be connected to an impurity region within a semiconductor substrate 100. In particular, the first electrode layer 130' is formed to be connected to a conductive contact plug 120 which is in contact with the impurity region (not shown). The contact plug 120 penetrates a lower interlayer dielectric layer 110 on the semiconductor substrate 100. A metal barrier layer (not shown), such as a Ti layer, can be formed between the contact plug 120 and the first electrode layer 130' before the first electrode layer 130' is formed. The first electrode layer 130' is formed using a platinum-group metal layer having low resistance and oxidation resistant characteristics. For example, a platinum (Pt) layer, a ruthenium (Ru) layer, an iridium (Ir) layer, a rhodium (Rh) layer, an osmium (Os) layer or a palladium (Pd) layer can be used as the first electrode layer 130'. In some cases, a platinum-group oxide layer or a composite of a platinum-group metal layer and the platinum-group oxide layer, is used to form the first electrode layer pattern 130'. Next, a ferroelectric layer 140' is formed on the first electrode layer 130'. The ferroelectric layer 140' may be formed by carrying out a sol-gel method using a spin coating, however, it is also possible to form the ferroelectric layer 140' through the use of a sputtering method or a chemical vapor deposition (CVD) method. The ferroelectric layer 140' is preferably a $SrTiO_3$ layer, a $BaTiO_3$ layer, a $(Ba, Sr)TiO_3$ layer, a $Pb(Zr, Ti)O_3$ layer, a $SrBi_2Ta_2O_9$ layer, a $(Pb, La)(Zr, Ti)O_3$ layer or a $Bi_4Ti_3O_{12}$ layer. Next, a second electrode layer 150' is formed on the ferrooelectric layer 140'. The second electrode layer 150' is preferably formed as a platinum-group metal layer and/or a platinum-group oxide layer.

Figure 5:
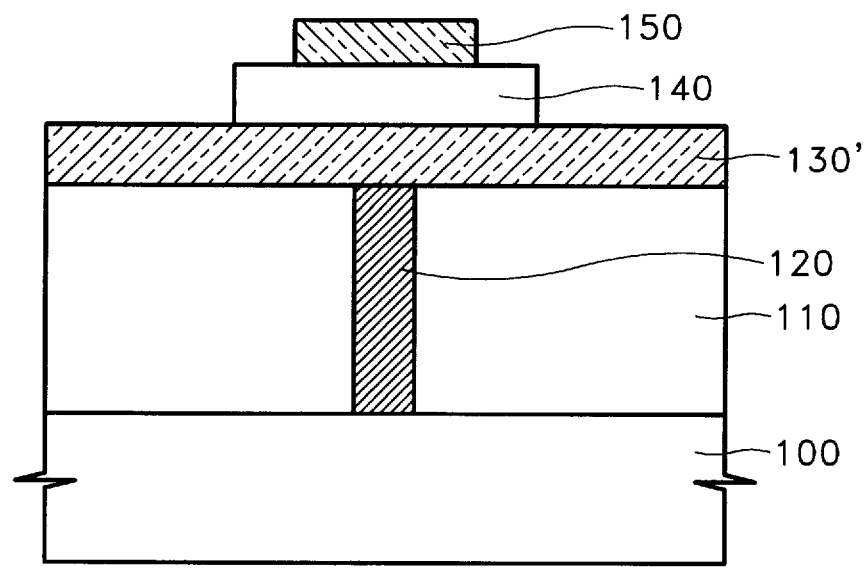

Referring to FIG. 5, a second electrode layer pattern 150 is formed by performing an etching process on the second electrode layer 150' using a predetermined mask layer pattern, such as a photoresist layer pattern and a TiN layer pattern (not shown) as an etching mask. The etching process can also be carried out by using a sputter etch technique. After the second electrode layer pattern 150 is formed, the mask layer pattern is removed. Next, a photoresist layer pattern (not shown) is formed and then a ferroelectric layer pattern 140 is formed by performing an etching process on the ferroelectric layer 140' using the photoresist layer pattern as an etching mask. The etching process can also be carried out by sputter etching the ferroelectric layer 140'. After the ferroelectric layer pattern 140 is formed, the photoresist layer pattern is removed. A thermal treatment process is then performed on the ferroelectric layer pattern 140 at a temperature in a range between about 400° C. and about 500° C. More preferably, the thermal treatment process is performed at a temperature of about 450° C. in order to recover and improve the characteristics of the ferroelectric material within the ferroelectric layer pattern 140.

Figure 6:
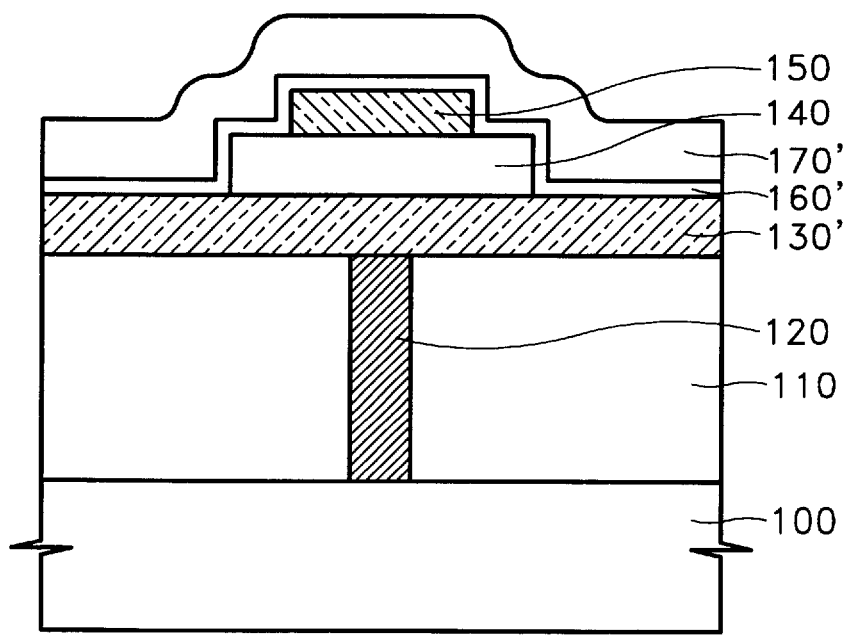

Referring now to FIG. 6, a preferred protective layer 160' is formed to cover the first electrode layer 130', the ferroelectric layer pattern 140 and the second electrode layer pattern 150. The protective layer 160' is an oxide layer that is free of hydrogen. An $Al_2O_3$ layer, a $TiO_2$ layer, a $SiO_2$ layer, a $ZrO_2$ layer or a $CeO_2$ layer can used as the oxide layer, however, other oxide layers can also be used. The protective layer 160' is formed to have a thickness of about 50 Å. The protective layer 160' may be formed using a chemical vapor deposition method and, more preferably, using an atomic layer deposition (ALD) method. Next, an etching mask layer 170' is formed on the protective layer 160'. A PSG layer can be used as the etching mask layer 170'. At this time, even if the PSG layer is formed through the use of a chemical vapor deposition method, hydrogen within the PSG layer typically cannot infiltrate into the ferroelectric layer pattern 140 because the protective layer 160' blocks hydrogen diffusion. As a result, the ferroelectric characteristics of the ferroelectric layer pattern 140 can be maintained.

Figure 7:
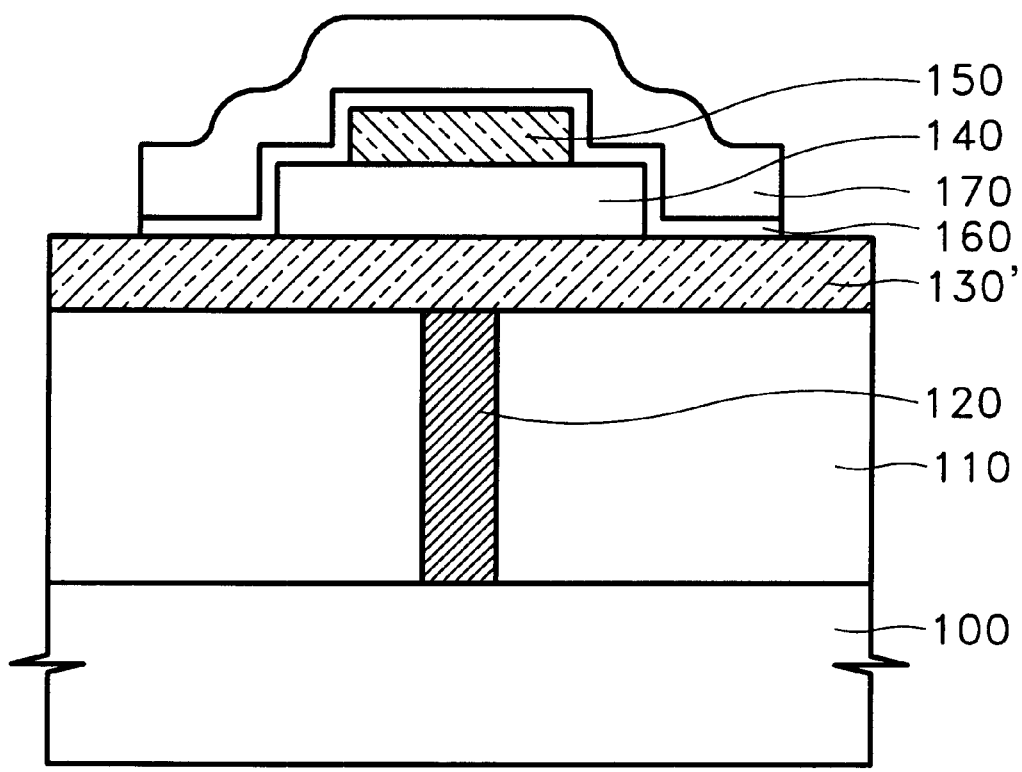

Referring to FIG. 7, an etching mask pattern 170 and a protective layer pattern 160 are formed by patterning the etching mask layer 170' and the protective layer 160' using a predetermined mask layer pattern (not shown), such as a photoresist layer pattern, as an etching mask. Next, the first electrode layer 130' is patterned using the etching mask layer pattern 170 and the protective layer pattern 160 as an etching mask, in order to form the first electrode layer pattern 130, as illustrated in FIG. 3. After the first electrode layer pattern 130 is formed, a thermal treatment process is performed at a temperature in a range between about 400° C. and 500° C. More preferably, the heat treatment step is performed at a temperature of about 450° C. If a first thermal treatment process has already been performed after formation of the ferroelectric layer pattern 140, the subsequent thermal treatment process can be omitted. Next, the interlayer dielectric layer 180 of FIG. 3 is formed over the resultant substrate. During the formation of the interlayer dielectric layer 180, hydrogen should not infiltrate into the ferroelectric layer pattern 140 because the protective layer pattern 160 operates as a hydrogen blocking layer. As a result, the ferroelectric layer pattern 140 is kept in a satisfactory condition without deterioration of its ferroelectric characteristics. After that, typical metal contact processes can be performed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit capacitor, comprising:
    a semiconductor substrate;
    a lower capacitor electrode having a surface and sidewalls on said semiconductor substrate;
    a capacitor dielectric layer comprising a ferroelectric material, on said lower capacitor electrode;
    an upper capacitor electrode on said capacitor dielectric layer; and
    a protective layer that encapsulates said upper capacitor electrode and said capacitor dielectric layer, said protective layer comprising a material that is substantially free of hydrogen and has a chemical and/or physical structure that blocks transfer of hydrogen therethrough and said protective layer extending on sidewalls of the capacitor dielectric layer without extending onto the sidewalls of the lower capacitor electrode.

2. The capacitor of claim 1, wherein said protective layer has a thickness greater than about 50 Å.

3. The capacitor of claim 1, wherein said protective layer comprises a metal oxide.

4. The capacitor of claim 1, wherein said protective layer comprises a metal oxide selected from the group consisting of $Al_2O_3$, $TiO_2$, $SiO_2$, $ZrO_2$ and $CeO_2$.

5. The capacitor of claim 1, wherein the ferroelectric material comprises one or more of the following materials: $SrTiO_3$, $(BaTiO_3)$, $(Ba, Sr)TiO_3$, $Pb(Zr, Ti)O_3$, $SrBi_2Ta_2O_9$, $(Pb, La)(Zr, Ti)O_3$ and $Bi_4Ti_3O_{12}$.

6. The capacitor of claim 1, wherein said lower and upper capacitor electrodes comprise a platinum-group metal layer, a platinum-group metal oxide layer or a composite of a platinum-group metal layer and a platinum-group metal oxide layer.

7. The capacitor of claim 6, wherein the platinum-group metal layer comprises one or more of the following materials:

platinum, ruthenium, iridium, rhodium, osmium and palladium.

8. A ferroelectric capacitor, comprising:

a first electrode layer pattern having a surface and sidewalls formed to be connected to an impurity region of the semiconductor substrate;

a ferroelectric layer pattern formed on the first electrode layer pattern;

a second electrode layer pattern formed on the ferroelectric layer pattern;

a dielectric protective layer which is formed to cover the first electrode layer pattern, the ferroelectric layer pattern and the second electrode layer pattern and is capable of preventing hydrogen components from infiltrating into the ferroelectric layer pattern, the dielectric protective layer extending on sidewalls of the ferroelectric layer pattern without extending onto the sidewalls of the first electrode layer pattern; and an interlayer dielectric layer formed on the protective layer.

9. The ferroelectric capacitor of claim 8, wherein the protective layer has a thickness of 50 Å or more.

10. The ferroelectric capacitor of claim 8, wherein the protective layer is a metal oxide layer that is free of hydrogen impurities.

11. The ferroelectric capacitor of claim 10, wherein the metal oxide layer is an $Al_2O_3$ layer, a $TiO_2$ layer, a $SiO_2$ layer, a $ZrO_2$ layer or a $CeO_2$ layer.

12. The ferroelectric capacitor of claim 10, wherein the metal oxide layer is deposited as an atomic layer.

13. The ferroelectric capacitor of claim 8, wherein the ferroelectric layer pattern is one selected from among a $SrTiO_3$ layer, a $BaTiO_3$ layer, a $(Ba, Sr)TiO_3$ layer, a $Pb(Zr, Ti))O_3$ layer, a $SrBi_2Ta_2O_9$ layer, a $(Pb, La)(Zr, Ti)O_3$ layer and a $Bi_4Ti_3O_{12}$ layer.

14. The ferroelectric capacitor of claim 8, wherein the first and second metal layer patterns each comprise a platinum-group oxide layer or a mixture layer of a platinum-group metal layer and the platinum-group oxide layer.

15. The ferroelectric capacitor of claim 14, wherein the platinum-group metal layer is one selected from among a platinum (Pt) layer, a ruthenium (Ru) layer, an iridium (Ir) layer, a rhodium (Rh) layer, an osmium (Os) layer and a palladium (Pd) layer.

16. The integrated circuit capacitor according to claim 1 wherein the capacitor dielectric layer does not extend on the entire surface of the lower capacitor electrode and wherein the protective layer extends on the surface of the lower capacitor electrode adjacent the capacitor dielectric layer.

17. The integrated circuit capacitor of claim 1 wherein the upper capacitor electrode does not extend on an entire surface of the capacitor dielectric layer opposite the lower capacitor electrode.

18. The ferroelectric capacitor according to claim 8 wherein the ferroelectric layer pattern does not extend on the entire surface of the first electrode layer pattern and wherein the dielectric protective layer extends on the surface of the first electrode layer pattern adjacent the ferroelectric layer pattern.

19. The ferroelectric capacitor of claim 8 wherein the second electrode layer pattern does not extend on an entire surface of the ferroelectric layer pattern opposite the first electrode layer pattern.

* * * * *